(12) United States Patent
Chen et al.

(10) Patent No.: US 8,405,096 B2
(45) Date of Patent: Mar. 26, 2013

(54) LED PACKAGE STRUCTURE

(75) Inventors: Chien-Min Chen, Hsinchu (TW);
Ko-Wei Chien, Hsinchu (TW);
Hung-Chin Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 156 days.

(21) Appl. No.: 12/888,399

(22) Filed: Sep. 22, 2010

(65) Prior Publication Data

US 2011/0095316 A1  Apr. 28, 2011

(30) Foreign Application Priority Data

Oct. 27, 2009 (CN) .......................... 2009 1 0181011

(51) Int. Cl.
*H01L 27/15* (2006.01)
*H01L 31/12* (2006.01)
*H01L 33/00* (2010.01)
(52) U.S. Cl. ....... 257/79; 257/81; 257/98; 257/E31.127; 257/E33.001
(58) Field of Classification Search ............... 257/79, 257/81, 98, 99, 100, E31.127, E33.001, E33.061
See application file for complete search history.

(56) References Cited

U.S. PATENT DOCUMENTS

| 7,190,003 B2* | 3/2007 | Isoda .............................. 257/98 |
| 2008/0237621 A1* | 10/2008 | Takemoto ....................... 257/98 |
| 2010/0073907 A1* | 3/2010 | Wanninger et al. ......... 362/97.1 |

FOREIGN PATENT DOCUMENTS

| CN | 1684278 A | 10/2005 |
| TW | 265647 A | 11/2006 |
| TW | 200725935 A | 7/2007 |

* cited by examiner

*Primary Examiner* — Hoai V Pham
(74) *Attorney, Agent, or Firm* — Altis Law Group, Inc.

(57) ABSTRACT

An LED package structure includes an LED die, a lead frame and a housing connecting to the lead frame. The LED die is located on a surface of the lead frame. The housing includes an inner face surrounding the LED die. The inner face has a bottom edge connected to the surface of the lead frame, a top edge and a waist line between the bottom edge and top edge. The bottom edge surrounds an area less than an area surrounded by the waist line. The area surrounded by the waist line is less than an area surrounded by the top edge. The inner face has a curved surface between the waist line and the bottom edge.

2 Claims, 10 Drawing Sheets

LED PACKAGE STRUCTURE

BACKGROUND

1. Technical Field

The present disclosure relates to an optical component, and particularly, to a light emitting diode (LED) package structure.

2. Description of Related Art

Refer to FIG. 1, related LED package structure 1 contains a lead frame 11, a housing 12 connected to the lead frame 11, an LED die 13 located on the lead 11 and surrounded by the housing 12, and an enclosure 14 covering the LED die 13 in the housing 12. The lead frame 11 has a surface 111 supporting the LED die 13. The housing 12 has beveled inner walls 121. The housing 12 only contacts a small area of the surface 111 of the lead frame 11, so the external moisture easily enters the light emitting diode package structure 1 between the enclosure 14 and the surface 111, and affects the adhesion between the enclosure 14, the lead frame 11, and the housing 12.

Accordingly, it is desirable to provide an LED package structure which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the disclosure will now be described in detail with reference to the accompanying drawings.

Figure 2:
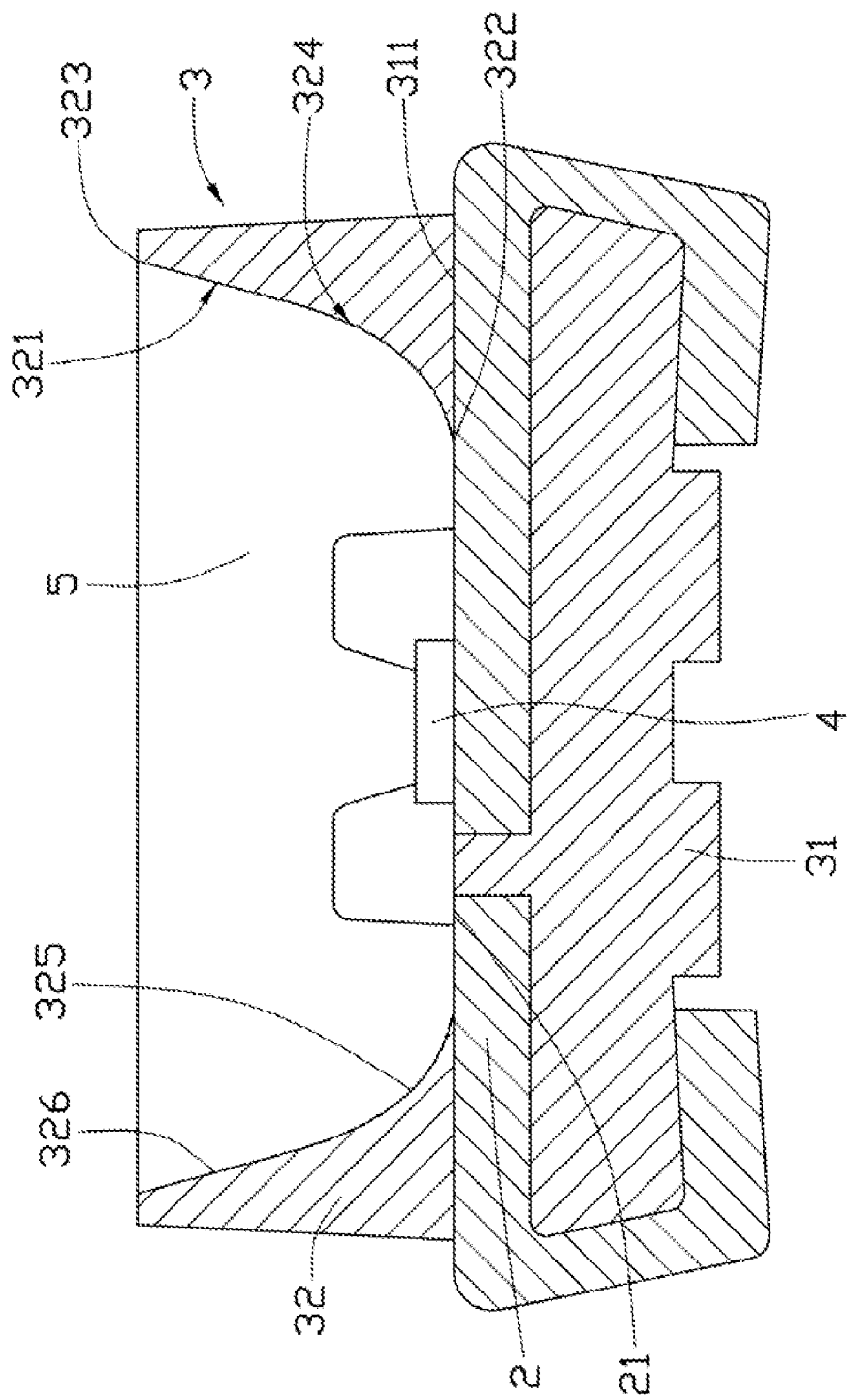
FIG. 2 is a cross-sectional view of an LED package structure according to an embodiment of the present disclosure.
Figure 3:
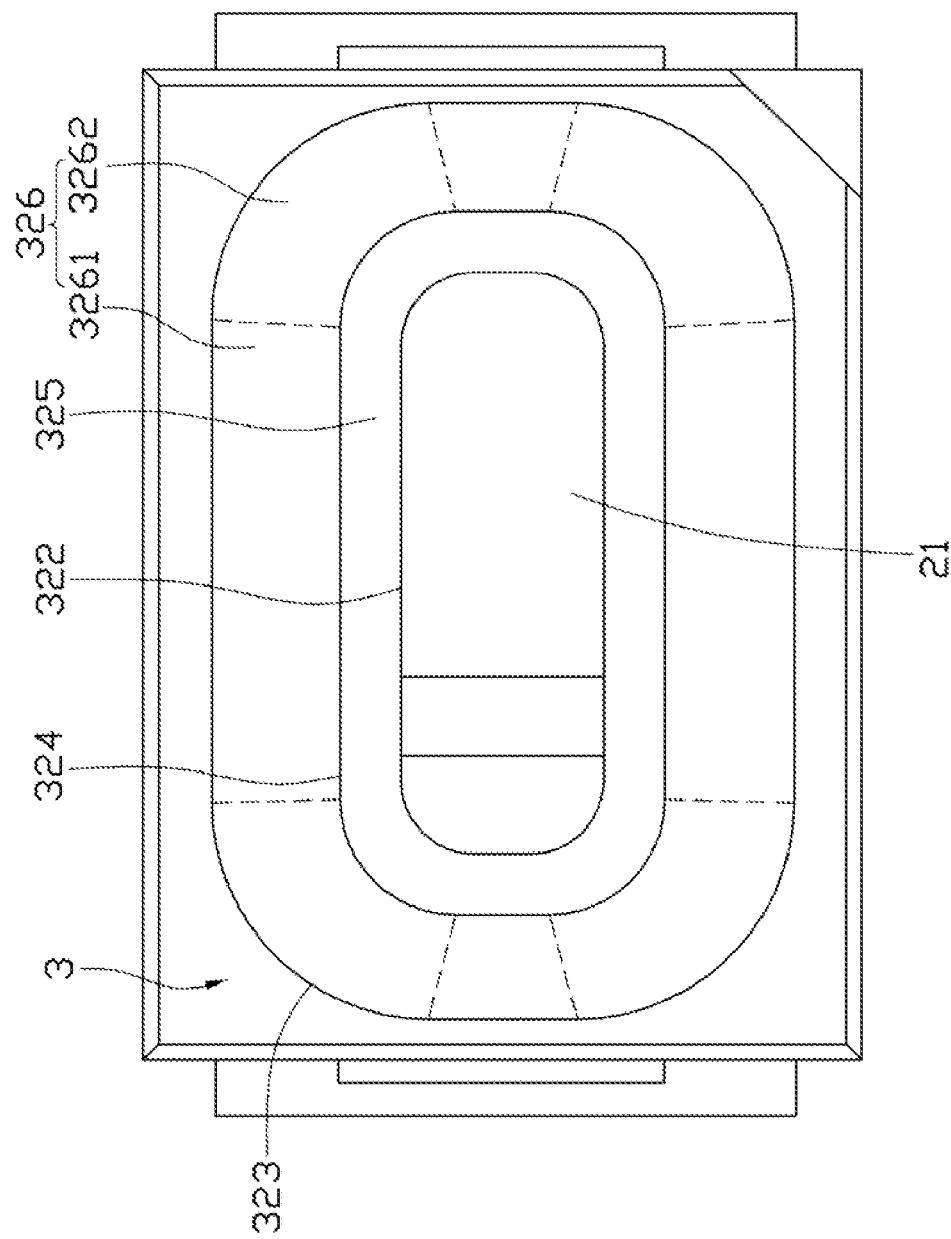
FIG. 3 is a top view of the LED package structure of FIG. 2.

As shown in FIG. 2 and FIG. 3, the LED package structure includes a lead frame 2, a housing 3, an LED die 4 and an enclosure 5 in this embodiment. It is noted that, FIG. 3 does not show the LED die 4 to place more emphasis on clearly illustrating the structure of the lead frame 2.

The lead frame 2 includes a surface 21 for placing the LED die 4. The lead frame 2 may be made out of copper. The LED die 4 may be electrically connected to the surface 21 of the lead frame 2 through wire bonding, as shown in FIG. 2; and may be electrically connected to the surface 21 of the lead frame 2 through flip-chip connection in other embodiments.

The housing 3 is made of reflective material, such as white plastic, so light emitted toward the housing 3 can be reflected toward the opening of the housing 3. The housing 3 is connected to the lead frame 2, and for example, through insert molding process. The housing 3 includes a base 31 connecting with the lead frame 2, and a reflective cup 32 extending from the base 31. The base 31 has a connecting surface 311. The reflective cup 32 has an inner face 321 surrounding and enclosing the LED die 4, so that the enclosure 5 can fill the housing 3 and cover the LED die 4.

The inner face 321 has a curved surface 325 connected to the surface 21 of the lead frame 2, a tilted surface 326 connected to the curved surface 325, a bottom edge 322 located between the curved surface 325 and the surface 21 of the lead frame 2, a waist line 324 located between the curved surface 325 and the tilted surface 326, and a top edge 323 opposite to the bottom edge 322. The waist line 324 is located between the bottom edge 322 and top edge 323.

Specifically speaking, the curved surface 325 is a concave bounded by the waist line 324 and the bottom edge 322; and the tilted surface 326 is bounded by the waist line 324 and the top edge 323. A radius of curvature of the curved surface 325 is in a range from about 300 micrometers to about 700 micrometers, and for example, is about 500 micrometers. An angle between the tilted surface 326 and the surface 21 of the lead frame 2 is substantially the same. For example, this angle is in a range from about 52.5° to about 77.5°, such as 65°.

Distance between the top edge 323 and the surface 21 is substantially the same; and distance between the waist line 324 and the surface 21 is substantially the same. The bottom edge 322, the waist line 324 and the top edge 323 are closed rings respectively, as shown in FIG. 3. The area surrounded by the bottom edge 322 is less than the area surrounded by the waist line 324, and the area surrounded by the waist line 324 is less than an area surrounded by the top edge 323.

In the top view shown in FIG. 3, each of the areas surrounded by the bottom edge 322, the waist line 324 and the top edge 323 is substantially a polygon (a rectangle in this embodiment) with rounded corners. Accordingly, the tilted surface 326 may have a plurality of plane portions 3261 between straight edges of the rectangles of the top edge 323 and the waist line 324, and a plurality of curve portions 3262 connecting the adjacent plane portions 3261, which are located between the rounded corners of the rectangles of the top edge 323 and the waist line 324.

Since the area surrounded by the waist line 324 is less than an area surrounded by the top edge 323, the tilted surface 326 is angled outward to reflect the incident light toward the opening of the housing 3. With the above-mentioned tilted surface 326 and radius of the curved surface 325, an improved illumination can be achieved.

The enclosure 5 includes a resin and phosphor therein, such as yttrium aluminum garnet (YAG, $Y_3Al_5O_{12}Ce$), which can turn portions of blue light emitted from the LED die 4 into yellow light.

Figure 4:
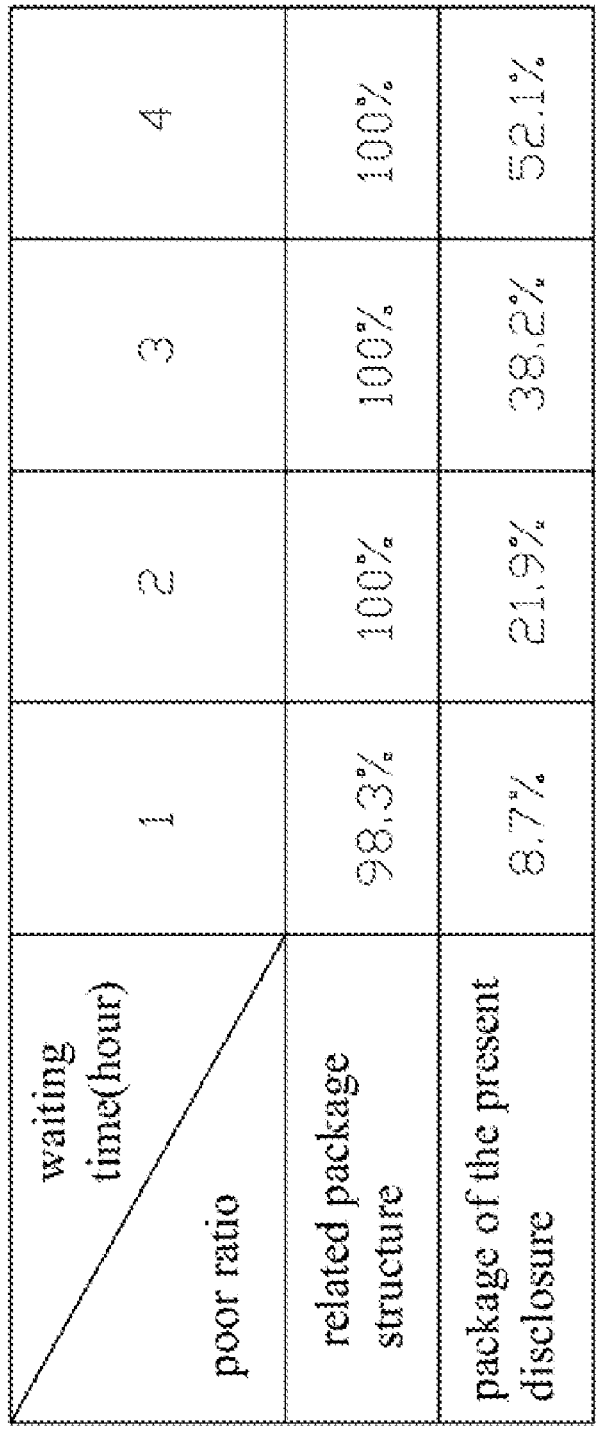
FIG. 4 illustrates a water-resistance test result of the LED package structure of FIG. 2 and the related LED package structure.

A water-resistance test is performed on the combination of the lead frame 2 and the housing 3. The combined lead frame 2 and housing 3 are baked at 150° C. for two hours to remove water therein, and then cooled down for one hour. Substantially, ink is dropped onto the inner face 321 of the housing 3, and the combined lead frame 2 and housing 3 stand for several hours. An observation is carried out to see if there is an overflow from the connecting surface 311 between the lead frame 2 and the housing 3. The test result is listed in the TABLE 1 of FIG. 4. As shown in FIG. 4, all the related package structures of FIG. 1 get seepage after two hours, and the present disclosure can effectively reduce the seepage with the use of the curved surface 325.

Another kind of water-resistance test is also performed on the combination of the lead frame 2, the housing 3 and the enclosure 5. The combined lead frame 2 and housing 3 are baked for one hour to remove water therein, and then cooled down for one hour. Substantially, the enclosure 5 is dropped onto the inner face 321 of the housing 3. Thereafter, the combination of the lead frame 2, the housing 3 and the enclosure 5 are baked at 150° C. for three hours, and then cooled down. In addition, the combination of the lead frame 2, the housing 3 and the enclosure 5 is baked three times in a high temperature reflow oven to simulate aging. Next, this package is placed in the high-boiling ink to see whether the test ink will penetrate into the housing 3 through the connecting surface 311. According to the test result, 35% of the related package structures of FIG. 1 get seepage, but no package of the present disclosure gets seepage.

Light is emitted from the LED die 4, through the enclosure 5, to the curved surface 325. Since the curved surface 325 is concave, the light reaching the curved surface 325 reflects with more efficiency toward the opening of the housing 3 than that of the light reaching the lead frame 11 of FIG. 1, and therefore light output is improved. Accordingly, the luminous intensity of the present disclosure can be increased by about 1% to 2% in comparison with the related package structures of FIG. 1. For example, the luminous intensity of this embodiment is increased by about 1.6%.

Figure 1:
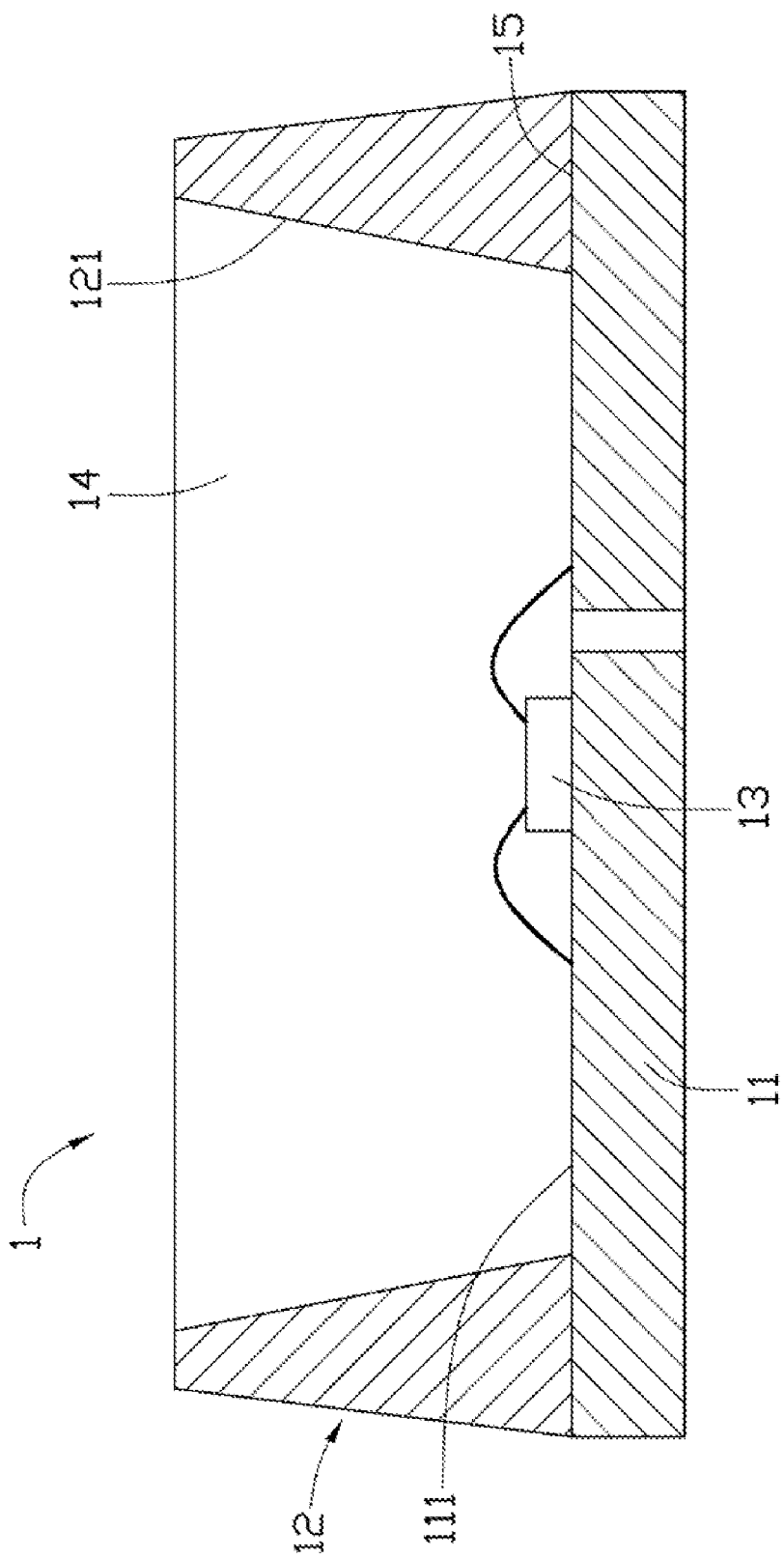
FIG. 1 is a cross-sectional view of a related LED package structure.
Figure 5:
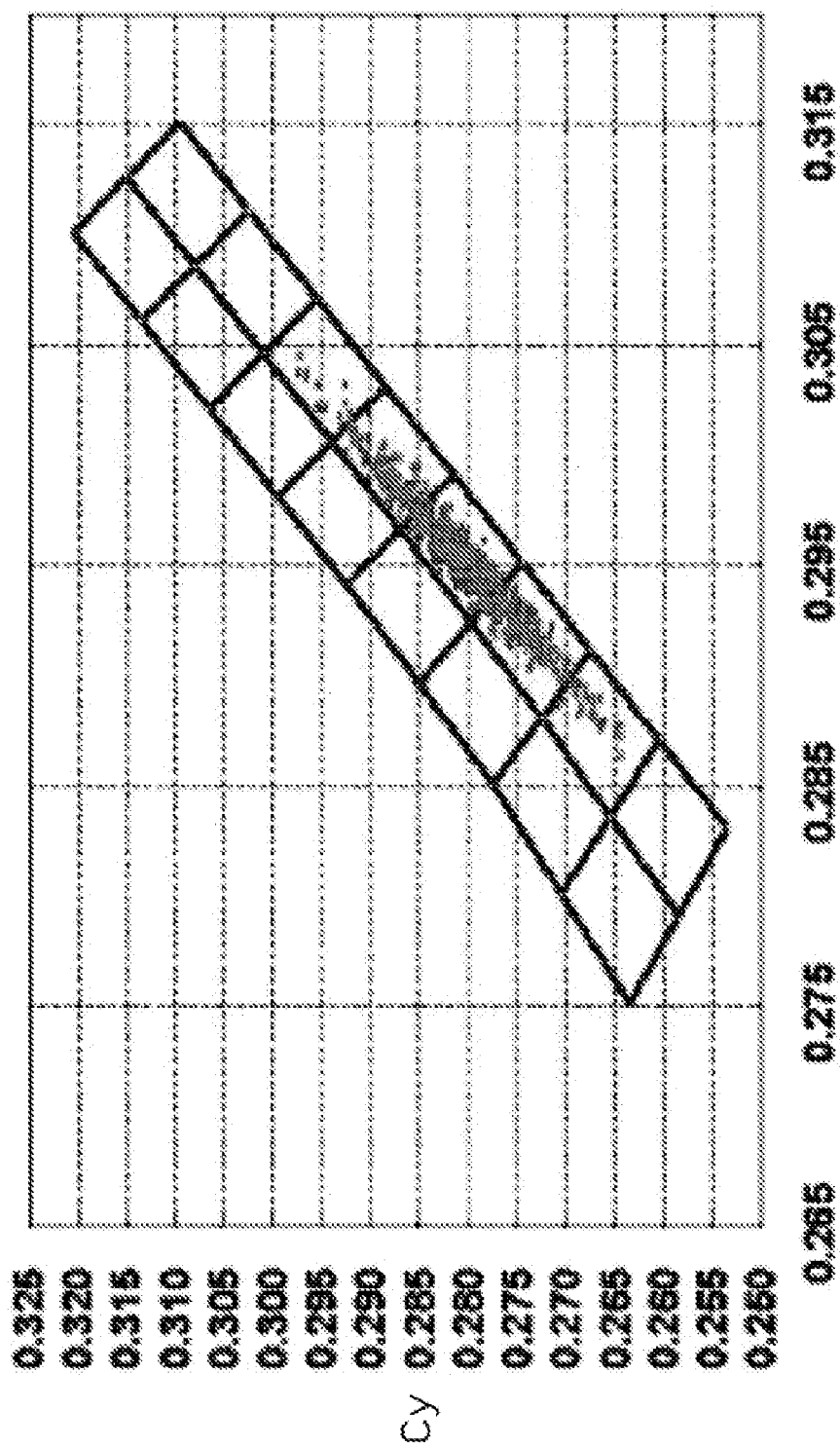
FIG. 5 is a Commission Internationale del'Eclairage (CIE, International Commission on Illumination) chromaticity diagram of the related LED package structure.
Figure 6:
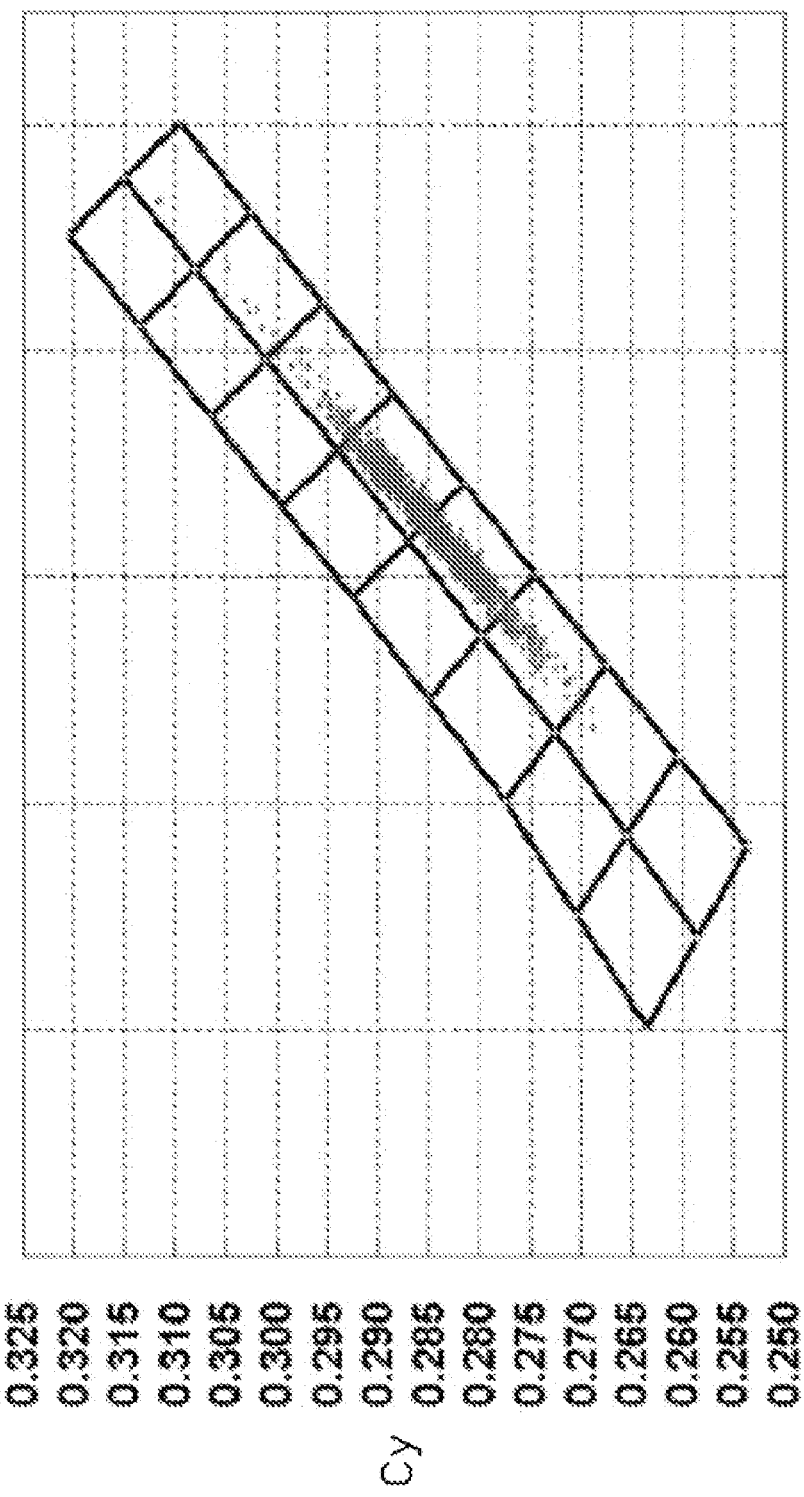
FIG. 6 is a CIE chromaticity diagram of the LED package structure of FIG. 2.

FIG. 5 and FIG. 6 are color statistics of two thousand LED package structures of this embodiment and the related LED package structures 1 of FIG. 1 respectively. The average light path in the enclosure 5 is longer than that in the related enclosure 14 of FIG. 1 due to the curved surface 325. Accordingly, the blue light emitted from the LED die 4 has more opportunity to hit the phosphor and be converted into yellow light. As shown in FIG. 5, the light presented by the related LED package structures 1 has a hue of blue in it instead of white. As shown in FIG. 6, the blue hue is reduced, and the hue of the LED package structures of this embodiment is more uniform than the related structures.

Figure 7:
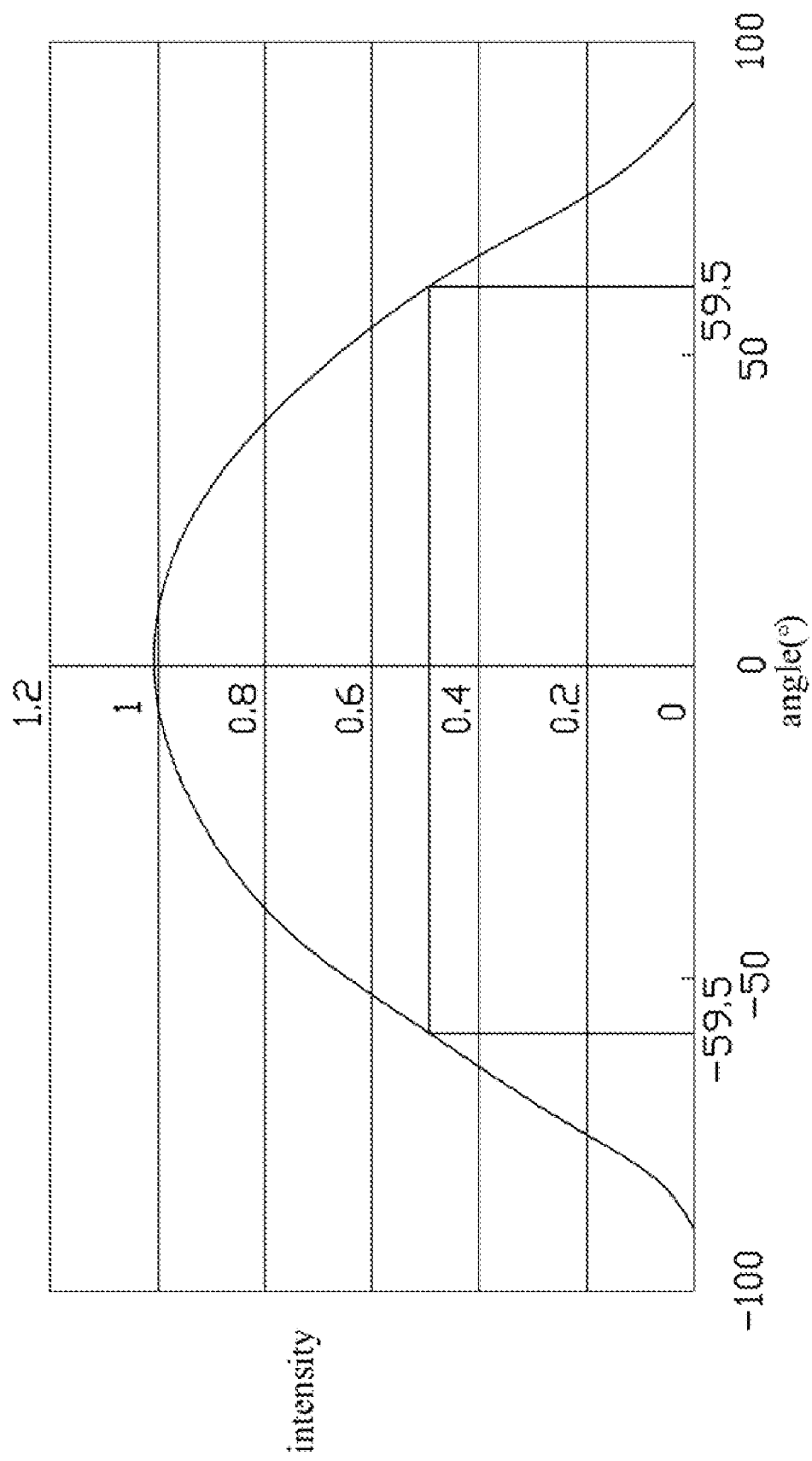
FIG. 7 is illustrates light intensity of the LED package structure along its long axis.
Figure 8:
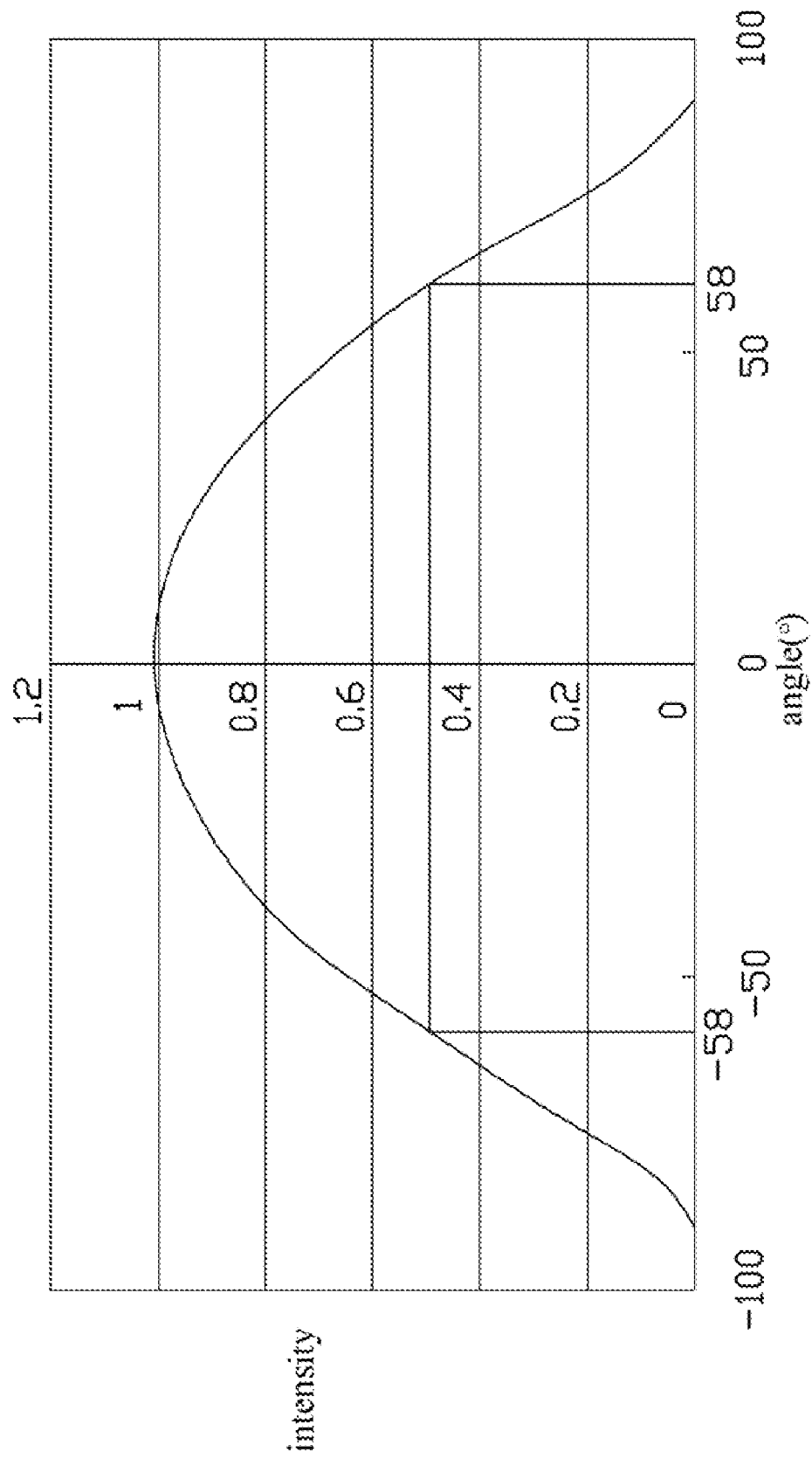
FIG. 8 is illustrates light intensity of the LED package structure along its short axis.

The curved surface 325 can increase the half-intensity angle of the LED package structure of this embodiment. As shown in FIG. 7, the half-intensity angle of the LED package structure along its long axis is about 119°. The half-intensity angle of the related LED package structure along its long axis is only 115°. By comparison, the half-intensity angle of the LED package structure is 4° larger than the related LED package structure. As shown in FIG. 8, the half-intensity angle of the LED package structure along its short axis is about 116°, which is 4° larger than the related LED package structure. Thus, this embodiment can provide LED package structures with a broader illumination angle.

Figure 9:
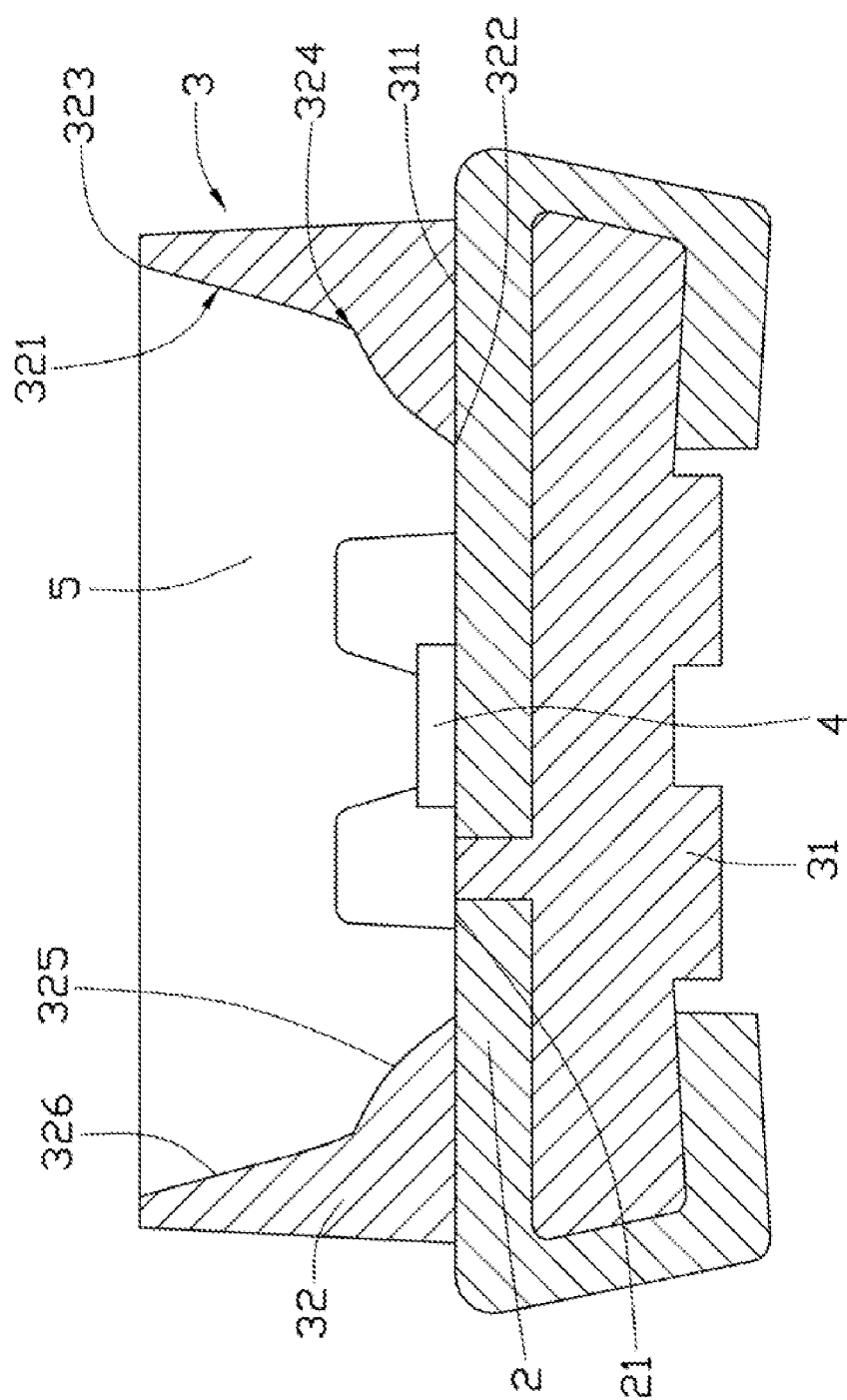
FIG. 9 is a cross-sectional view of an LED package structure according to a second embodiment of the present disclosure.

The present disclosure uses the curved surface 325 to increase the light-traveling path, and variations do not alter the spirit of the present disclosure. For example, the curved surface 325 may be convex, as shown in FIG. 9. The area surrounded by the bottom edge 322 is still less than the area surrounded by the waist line 324, and the water-resistance can also be improved due to the lager engaging surface area between connecting surface 311 of the housing 3 and the surface 21 of the lead frame 2. The inner face 321 may include surfaces with different angles between the waist line 324 and the top edge 323.

Figure 10:
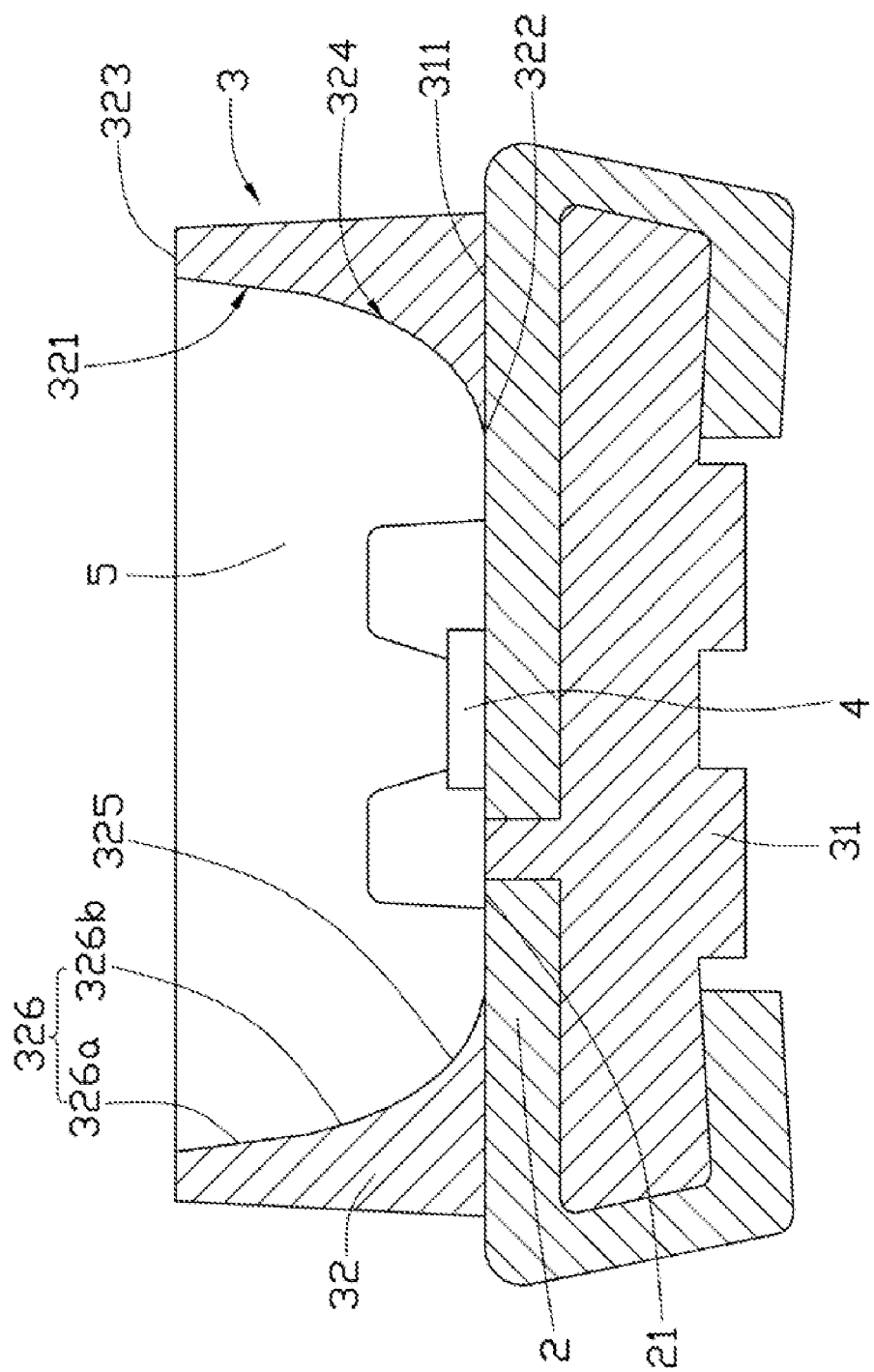
FIG. 10 is a cross-sectional view of an LED package structure according to a third embodiment of the present disclosure.

As shown in FIG. 10, the tilted surface 326 has a first tilted surface 326a and a second tilted surface 326b both located between the waist line 324 and the top edge 323. The first tilted surface 326a and the second tilted surface 326b are tilted in different angles to the surface of the lead frame. The angles of the first and second tilted surface 326a and 326b to the surface 21 may be still in the range from about 52.5° to about 77.5°. In this embodiment, the angle between the first tilted surface 326a and the surface 21 of the lead frame 2 is larger than the angle between the second tilted surface 326b and the surface 21, but is not limited thereto.

With the inclusion of the curved surface 325, a covered area of the lead frame 2 covered by the housing 5 is increased, and thereby the water-resistance therebetween is enhanced. Thus, the resistance of the LED package structure to the surrounding moisture is increased by longer path from the surroundings to the LED die 4. In addition, the present disclosure can increase the luminous intensity of the LED package structure by about 1% to 2% by the curved surface 325. The light extraction increase is also attributed to the reflection of the curved surface 325. The reflected light has a longer traveling path, which results in an increase in probability of collision with phosphor filled in the housing 5, thereby achieving a better distribution on CIE and a better half-intensity angle.

It is to be understood, however, that even though numerous characteristics and advantages of the present embodiments have been set fourth in the foregoing description, together with details of the structures and functions of the embodiments, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A light emitting diode (LED) package structure, comprising:
   a lead frame;
   an LED die located on a surface of the lead frame; and
   a housing made of electrically insulating and reflective material and connecting to the lead frame, the housing comprising a base and a reflective cup extending upwardly from the base, the base and the reflective cup being integrally formed as a single piece, the reflective cup comprising an inner face surrounding the LED die, the inner face comprising:
   a bottom edge connected to the surface of the lead frame;
   a top edge;
   a waist line located between the bottom edge and top edge, an area surrounded by the bottom edge being less than an area surrounded by the waist line, the area surrounded by the waist line is less than an area surrounded by the top edge; and
   a curved surface located between the waist line and the bottom edge;
   wherein the curved surface is a concave;
   wherein the inner face comprises a tilted surface bounded by the waist line and the top edge; and
   wherein the area surrounded by the top edge is substantially a polygon with rounded corners in a top view.

2. The LED package structure of claim 1, wherein the tilted surface comprises:
   a plurality of plane portions corresponding to straight edges of the polygon; and
   a plurality of curve portions connecting the adjacent plane portions.

* * * * *